US009178333B2

(12) United States Patent
Tayebati et al.

(10) Patent No.: US 9,178,333 B2
(45) Date of Patent: Nov. 3, 2015

(54) HIGH-POWER LASER DIODE ISOLATION AND THERMAL MANAGEMENT

(71) Applicants: Parviz Tayebati, Sherborn, MA (US); Bien Chann, Merrimack, NH (US); Robin Huang, North Billerica, MA (US); Bryan Lochman, Somerville, MA (US); James Burgess, Wilmington, MA (US)

(72) Inventors: Parviz Tayebati, Sherborn, MA (US); Bien Chann, Merrimack, NH (US); Robin Huang, North Billerica, MA (US); Bryan Lochman, Somerville, MA (US); James Burgess, Wilmington, MA (US)

(73) Assignee: TeraDiode, Inc., Wilmington, MA (US)

( * ) Notice: Subject to any disclaimer, the term of this patent is extended or adjusted under 35 U.S.C. 154(b) by 0 days.

(21) Appl. No.: 14/666,438

(22) Filed: Mar. 24, 2015

(65) Prior Publication Data

US 2015/0280396 A1 Oct. 1, 2015

Related U.S. Application Data

(60) Provisional application No. 61/972,303, filed on Mar. 29, 2014, provisional application No. 62/011,958, filed on Jun. 13, 2014.

(51) Int. Cl.
*H01S 3/04* (2006.01)
*H01S 5/024* (2006.01)
*H01S 5/042* (2006.01)
*H01S 5/183* (2006.01)
*H01S 5/34* (2006.01)
*H01S 5/32* (2006.01)
*H01S 5/40* (2006.01)
*H01S 5/022* (2006.01)

(52) U.S. Cl.
CPC ............. *H01S 5/02423* (2013.01); *H01S 5/022* (2013.01); *H01S 5/02469* (2013.01); *H01S 5/02476* (2013.01); *H01S 5/0425* (2013.01); *H01S 5/183* (2013.01); *H01S 5/32* (2013.01); *H01S 5/3401* (2013.01); *H01S 5/4012* (2013.01); *H01S 5/4087* (2013.01)

(58) Field of Classification Search
USPC .......................................... 372/34–36, 43.01
See application file for complete search history.

(56) References Cited

U.S. PATENT DOCUMENTS

| | | | |
|---|---|---|---|
| 3,551,842 A * | 12/1970 | Nelson ........................ | 372/46.01 |
| 5,621,243 A * | 4/1997 | Baba et al. .................... | 257/712 |
| 6,192,062 B1 | 2/2001 | Sanchez-Rubio et al. | |
| 2002/0110165 A1 | 8/2002 | Filgas | |
| 2008/0056314 A1 | 3/2008 | Coleman et al. | |
| 2008/0069160 A1 | 3/2008 | Stephens | |
| 2011/0142087 A1 | 6/2011 | Schroeder et al. | |

OTHER PUBLICATIONS

International Search Report and Written Opinion issued in corresponding International Patent Application No. PCT/US2015/022152 dated Jul. 8, 2015.

\* cited by examiner

*Primary Examiner* — Dung Nguyen
(74) *Attorney, Agent, or Firm* — Morgan, Lewis & Bockius LLP

(57) ABSTRACT

In various embodiments, a laser apparatus includes a beam emitter, first and second mounts disposed on opposing sides of the beam emitter and in electrical and thermal contact therewith, and a housing body for conducting heat away from the beam emitter.

26 Claims, 5 Drawing Sheets

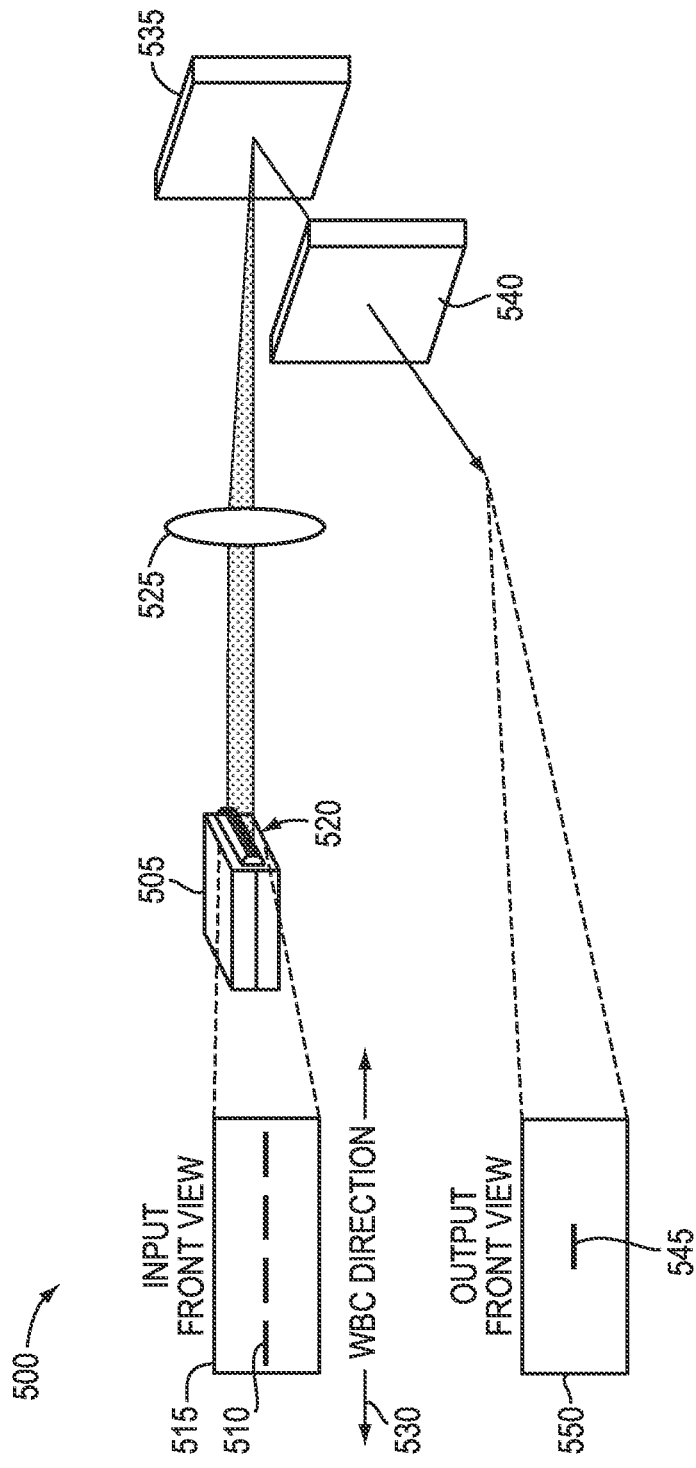

HIGH-POWER LASER DIODE ISOLATION AND THERMAL MANAGEMENT

RELATED APPLICATIONS

This application claims the benefit of and priority to U.S. Provisional Patent Application No. 61/972,303, filed Mar. 29, 2014, and U.S. Provisional Patent Application No. 62/011,958, filed Jun. 13, 2014, the entire disclosure of each of which is hereby incorporated herein by reference.

TECHNICAL FIELD

In various embodiments, the present invention relates to laser diodes, specifically apparatus for thermal management and electrical isolation of laser diodes.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. Typically higher laser powers involve the driving of laser diodes at increasingly higher currents, which results in higher operating temperatures and concomitant thermal-management issues aimed at preventing temperature-based reliability issues. Thus, there is a need for improved thermal-management systems for high-power lasers (e.g., laser diodes), particularly such systems that also provide electrical insulation from other system components.

SUMMARY

In accordance with embodiments of the present invention, laser diodes (e.g., single laser diodes, laser diode bars, or arrays thereof) are thermally managed via a package that incorporates highly thermally and electrically conductive electrodes for driving the laser diode, as well as a thermally conductive mount (that may be liquid cooled) that is electrically isolated from the electrodes. Specifically, the electrodes may include or consist essentially of copper and be electrically connected to the anode and cathode of the laser diode. The mount may include or consist essentially of, e.g., aluminum, and may incorporate an electrically insulating layer between the mount and the electrode facing the mount. For example, the electrically insulating layer may include or consist essentially of aluminum oxide and/or aluminum nitride layers that provide thermal conductivity therethrough but retard or substantially prevent electrical conduction therethrough. Aluminum nitride advantageously has a high thermal conductivity but a low electrical conductivity. As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. As utilized herein, materials with a high electrical resistivity, or "electrically insulating materials," have an electrical resistivity of at least $1 \times 10^8$ ohm·meter ($\Omega \cdot m$), at least $1 \times 10^{10}$ $\Omega \cdot m$, or even at least $1 \times 10^{12}$ $\Omega \cdot m$.

Laser diodes utilizing packaging schemes in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

As known to those of skill in the art, lasers are generally defined as devices that generate visible or invisible light through stimulated emission of light. Lasers generally have properties that make them useful in a variety of applications, as mentioned above. Common laser types include semiconductor lasers, solid-state lasers, fiber lasers, and gas lasers. Semiconductor lasers (mostly laser diodes) may be electrically or optically pumped and generally efficiently generate very high output powers often at the expense of poor beam quality. Semiconductor lasers may produce low power with good spatial properties for application in, e.g., optical disc players. Yet other semiconductor lasers may be suitable for producing high pulse rate, low power pulses (e.g., for telecommunications applications). Special types of semiconductor lasers include quantum cascade lasers (for mid-infrared light) and surface-emitting semiconductor lasers (VCSELs and VECSELs), the latter also being suitable for pulse generation with high powers.

Solid-state lasers may be based on ion-doped crystals or glasses (e.g., doped insulator lasers) and may pumped with discharge lamps or laser diodes for generating high output power. Alternatively solid-state lasers may produce low power output with very high beam quality, spectral purity and/or stability (e.g. for measurement purposes). Some solid-state lasers may produce ultra-short pulses with picosecond or femtosecond durations. Common gain media for use with solid state lasers include: Nd:YAG, Nd:YVO$_4$, Nd:YLF, Nd:glass, Yb:YAG, Yb:glass, Ti:sapphire, Cr:YAG, and Cr:L-iSAF.

Fiber lasers may be based on optical glass fibers which are doped with some laser-active ions in the fiber core. Fiber lasers may achieve extremely high output powers (up to kilowatts) with high beam quality. Narrow line width operation and the like may also be supported by fiber lasers. Gas lasers may include helium-neon lasers, $CO_2$ lasers, argon ion lasers, and the like may be based on gases which are typically excited with electrical discharges. Frequently used gases include $CO_2$, argon, krypton, and gas mixtures such as helium-neon. In addition, excimer lasers may be based on any of ArF, KrF, XeF, and $F_2$. Other less common laser types include chemical and nuclear pumped lasers, free electron lasers, and X-ray lasers.

A laser diode, such as a laser diode described in the following general description may be used in association with embodiments of the innovations described herein. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double heterostructure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that is usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators may be used to collimate the output beam along the fast-axis. Array of aspherical cylindrical lenses are often used for collimation of each laser element along the array or slow-axis. To achieve beams with approximately circular beam waist a special beam shaper for symmetrization of the beam quality of each diode bar or array can be applied. A degrading property of diode bars is the "smile"—a slight bend of the planar nature of the connected emitters. Smile errors may have detrimental effects on the ability to focus beams from diode bars. Another degrading property is collimation error of the slow and fast-axis. For example, a twisting of the fast-axis collimation lens results in an effective smile. This has detrimental effects on the ability to focus. In stacks, "pointing" error of each bar is often the most dominant effect. Pointing error is a collimation error and is the result of the array or bar that is offset from the fast-axis lens. An offset of 1 µm is the same as the whole array having a smile of 1 µm.

Diode bars and diode arrays overcome limitations of very broad single emitters, such as amplified spontaneous emission or parasitic lasing in the transverse direction or filament formation. Diode arrays may also be operated with a more stable mode profile, because each emitter produces its own beam. Techniques which exploit some degree of coherent coupling of neighbored emitters may result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator without beam conditioning in the slow-axis direction, or a more complex beam shaper to better preserve the brightness. It is also possible to launch the beamlets from the emitters into a fiber bundle (with one fiber per emitter). Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength may also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser apparatus that includes or consists essentially of a beam emitter, first and second electrode mounts, a housing body, and insulating layer, and a thermal bonding layer. The beam emitter has first and second opposed surfaces. The first electrode mount is disposed beneath and in thermal and electrical contact with the first surface of the beam emitter. The second electrode mount is (i) disposed over and in thermal and electrical contact with the second surface of the beam emitter and (ii) electrically insulated from the first electrode mount. The housing body is thermally and electrically conductive and is disposed beneath the first electrode mount. The insulating layer is disposed over the housing body and electrically insulates the housing body from the first electrode mount. The insulating layer provides thermal conductivity between the first electrode mount and the housing body. The thermal bonding layer is disposed between the insulating layer and the first electrode mount. The thermal bonding layer is electrically conductive and improves thermal conduction between the first electrode mount and the insulating layer.

Embodiments of the invention may include one or more of the following in any of a variety of combinations. The beam emitter may include or consist essentially of one or more diode bars each emitting a plurality of discrete beams (e.g., laser beams). The first and/or second electrode mount may include, consist essentially of, or consist of copper, silver, or gold. The housing body may include, consist essentially of, or consist of aluminum. The insulating layer may include, consist essentially of, or consist of aluminum nitride and/or aluminum oxide. The insulating layer may include, consist essentially of, or consist of a first sub-layer of aluminum nitride disposed above or below (and may be in direct contact with) a second sub-layer of aluminum oxide. A first interfacial layer may be disposed between the insulating layer and the thermal bonding layer. A second interfacial layer may be disposed between the insulating layer and the housing body. The first and/or second interfacial layer may include, consist essentially of, or consist of copper, silver, or gold. A second thermal bonding layer may be disposed between (and may be in direct contact with) the second interfacial layer and the housing body. The second thermal bonding layer may include, consist essentially of, or consist of indium (e.g., indium solder, indium paste, etc.) and/or silver (e.g., silver solder, silver paste, etc.) The thermal bonding layer may include, consist essentially of, or consist of indium (e.g., indium solder, indium paste, etc.) and/or silver (e.g., silver solder, silver paste, etc.). The housing body may define therewithin one or more cooling channels for the flow of cooling fluid (e.g., water or another heat-transfer liquid) therethrough.

In another aspect, embodiments of the invention feature a laser apparatus that includes or consists essentially of a beam emitter, first and second electrode mounts, a housing body, and insulating layer, a thermal bonding layer, and first and second interfacial layers. The beam emitter has first and second opposed surfaces. The first electrode mount is disposed beneath and in thermal and electrical contact with the first surface of the beam emitter. The first electrode mount includes, consists essentially of, or consists of copper. The second electrode mount is (i) disposed over and in thermal and electrical contact with the second surface of the beam emitter and (ii) electrically insulated from the first electrode mount. The second electrode mount includes, consists essentially of, or consists of copper. The housing body is thermally and electrically conductive and is disposed beneath the first electrode mount. The housing body includes, consists essentially of, or consists of aluminum. The insulating layer is disposed over the housing body and electrically insulates the housing body from the first electrode mount. The insulating layer provides thermal conductivity between the first electrode mount and the housing body. The insulating layer includes, consists essentially of, or consists of aluminum nitride. The thermal bonding layer is disposed between the insulating layer and the first electrode mount. The thermal bonding layer is electrically conductive and improves thermal conduction between the first electrode mount and the insulating layer. The thermal bonding layer includes, consists essentially of, or consists of indium (e.g., indium solder, indium paste, etc.) and/or silver (e.g., silver solder, silver paste, etc.). The first interfacial layer is disposed between the insulating layer and the thermal bonding layer. The first interfacial layer includes, consists essentially of, or consists of copper, silver, or gold. The second interfacial layer is disposed between the insulating layer and the housing body. The second interfacial layer includes, consists essentially of, or consists of copper, silver, or gold.

Embodiments of the invention may include one or more of the following in any of a variety of combinations. A second thermal bonding layer may be disposed between the second interfacial layer and the housing body. The second thermal bonding layer may improve thermal conduction between the insulating layer and the housing body. The second thermal bonding layer may be electrically conductive. The second thermal bonding layer may include, consist essentially of, or consist of indium (e.g., indium solder, indium paste, etc.) and/or silver (e.g., silver solder, silver paste, etc.). The housing body may define therewithin one or more cooling channels for the flow of cooling fluid therethrough. The beam emitter may include or consist essentially of one or more diode bars each emitting a plurality of discrete beams (e.g., laser beams).

In yet another aspect, embodiments of the invention feature a wavelength beam combining laser system that includes or consists essentially of a beam emitter, focusing optics, a dispersive element, a partially reflective output coupler, first and second electrode mounts, a housing body, an insulating layer, and a thermal bonding layer. The beam emitter emits a plurality of discrete beams (e.g., laser beams) and has first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element. The first electrode mount is disposed beneath and in thermal and electrical contact with the first surface of the beam emitter. The second electrode mount is (i) disposed over and in thermal and electrical contact with the second surface of the beam emitter and (ii) electrically insulated from the first electrode mount. The housing body is thermally and electrically conductive. The housing body is disposed beneath the first electrode mount. The insulating layer is disposed over (and may be in contact with) the housing body. The insulating layer electrically insulates the housing body from the first electrode mount. The insulating layer provides thermal conductivity between the first electrode mount and the housing body. The thermal bonding layer is disposed between the insulating layer and the first electrode mount. The thermal bonding layer is electrically conductive and improves thermal conduction between the first electrode mount and the insulating layer.

Embodiments of the invention may include one or more of the following in any of a variety of combinations. The dispersive element may include or consist essentially of a diffraction grating. The first and/or second electrode mount may include, consist essentially of, or consist of copper, silver, or gold. The housing body may include, consist essentially of, or consist of aluminum. The insulating layer may include, consist essentially of, or consist of aluminum nitride and/or aluminum oxide. The insulating layer may include, consist essentially of, or consist of a first sub-layer of aluminum nitride disposed above or below (and may be in direct contact with) a second sub-layer of aluminum oxide. A first interfacial layer may be disposed between (and may be in contact with) the insulating layer and the thermal bonding layer. A second interfacial layer may be disposed between (and may be in contact with) the insulating layer and the housing body. The first and/or second interfacial layer may include, consist essentially of, or consist of copper, silver, or gold. A second thermal bonding layer may be disposed between (and may be in direct contact with) the second interfacial layer and the housing body. The second thermal bonding layer may include, consist essentially of, or consist of indium (e.g., indium solder, indium paste, etc.) and/or silver (e.g., silver solder, silver paste, etc.) The thermal bonding layer may include, consist essentially of, or consist of indium (e.g., indium solder, indium paste, etc.) and/or silver (e.g., silver solder, silver paste, etc.). The housing body may define therewithin one or more cooling channels for the flow of cooling fluid (e.g., water or another heat-transfer liquid) therethrough.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 5 is a schematic view of a wavelength beam combining laser system incorporating a packaged laser in accordance with embodiments of the invention.

DETAILED DESCRIPTION

Figure 1:
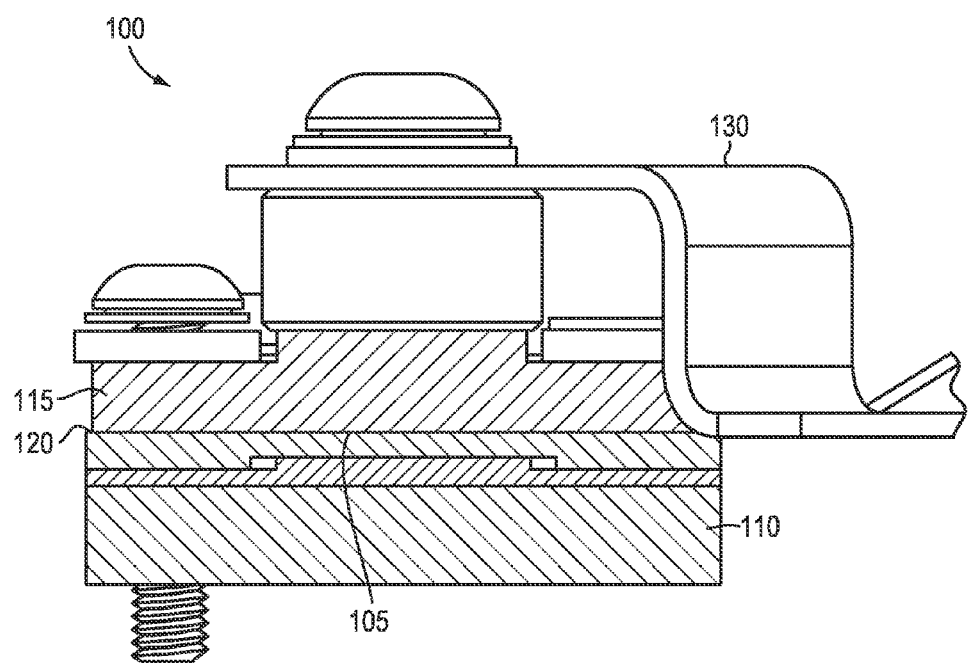
FIGS. 1 and 2 are, respectively, a side view and a perspective view of a packaged laser in accordance with embodiments of the invention.
Figure 2:
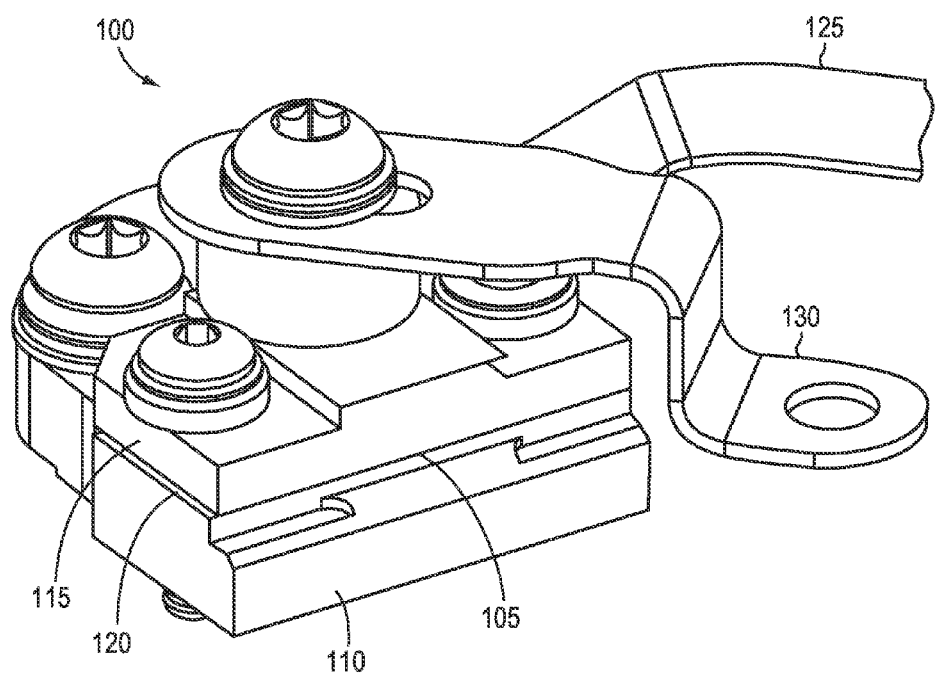

FIGS. 1 and 2 depict portions of an exemplary packaged laser 100 in accordance with embodiments of the present invention. As shown, the laser 100 includes a beam emitter 105 sandwiched between two electrode mounts 110, 115. The beam emitter 105 may include or consist essentially of, e.g., a laser diode, a diode bar, an array of laser diodes, an array of diode bars, or one or more vertical cavity surface-emitting lasers (VCSELs). The electrode mounts 110, 115 are thermally connected to the beam emitter 105 and each electrically connected to one of the electrodes (i.e., the anode and the cathode) of the beam emitter 105. For example, the electrode mount 110 may be electrically connected to the anode of beam emitter 105 and the electrode mount 115 may be electrically connected to the cathode of beam emitter 105, or vice versa. The electrode mounts 110, 115 are typically highly thermally and electrically conductive; thus, in various embodiments, the electrode mounts 110, 115 include, consist essentially of, or consist of one or more metals such as copper, silver, or gold. An insulating layer 120 is disposed around the beam emitter 105 and between the electrode mounts 110, 115, thereby electrically isolating the electrode mounts 110, 115 from each other. As shown, the electrode mounts 110, 115 may be fastened together and to the beam emitter 105 via, e.g., one or more fasteners such as screws, which may also attach the electrode mounts to a housing (as detailed below). Conductive contacts 125, 130 are connected to and extend from the electrode mounts 110, 115 in order to facilitate interconnection of the laser 100 to, for example, other laser devices (in series or in parallel) or to a source of electrical power (e.g., a current source).

Figure 3:
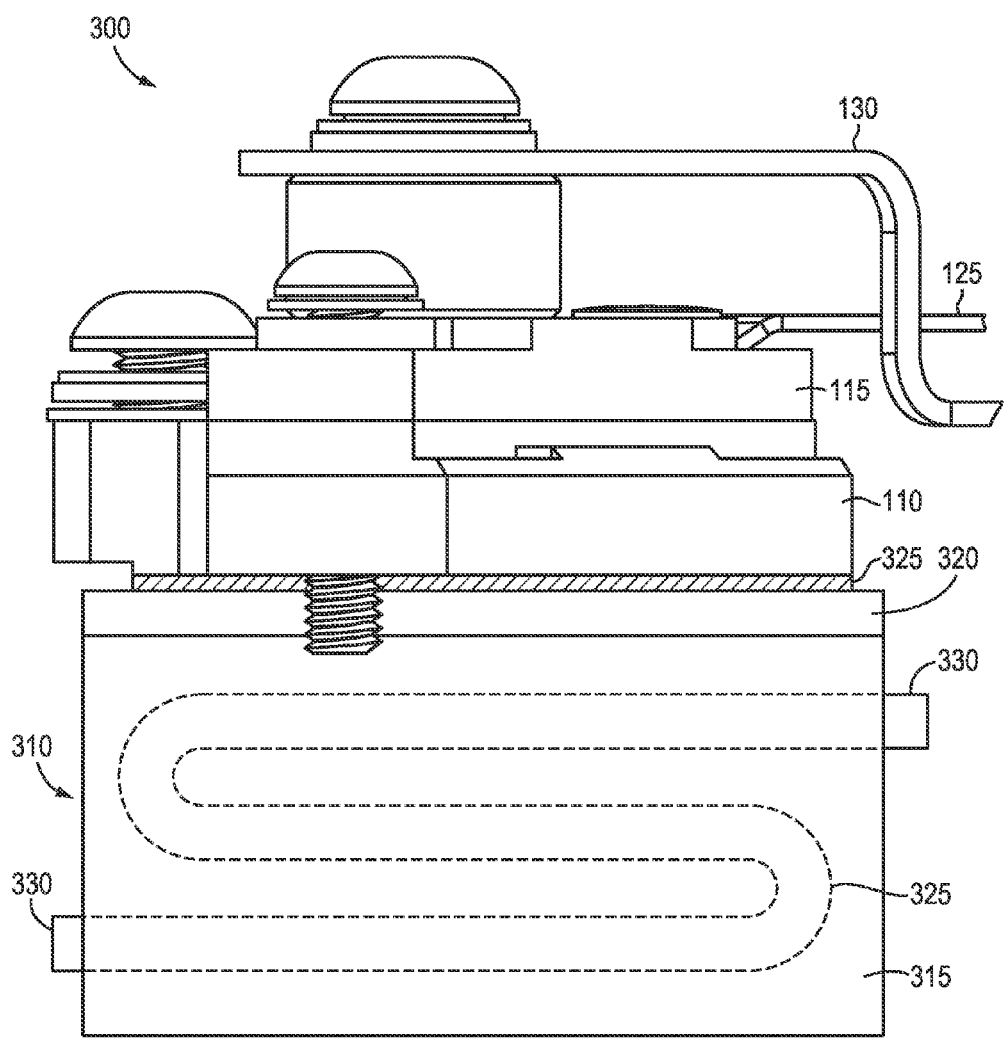
FIGS. 3 and 4 are side views of packaged lasers in accordance with embodiments of the invention.

FIG. 3 depicts a laser device 300 in which one or both electrode mounts 110, 115 are fastened or affixed to a thermally conductive housing 310. The housing 310 may include or consist essentially of a housing body 315 capped with an insulating layer 320 that retards or substantially prevents electrical conduction between the electrode mount 110 and the housing body 315 while maintaining thermally conductivity therebetween. For example, the insulating layer 320 may include, consist essentially of, or consist of aluminum nitride, boron arsenide, diamond, and/or beryllium oxide. The housing body 315 may include, consist essentially of, or consist of one or more thermally conductive metals or ceramic materials. In an embodiment, the housing body 315 includes, consists essentially, or consists of a thermally conductive metal such as aluminum or copper. As shown in FIG. 3, the housing body 315 may also incorporate therewithin one or more cooling channels 325 through which a coolant (e.g., a liquid such as water) may flow to remove heat from the housing body. A coolant source and coolant sink may be connected to the cooling channel 325 via coolant interconnections 330. A coolant reservoir and, e.g., a heat exchanger, may be fluidly connected to the cooling channel 325 and provide coolant thereto. Such cooling systems are conventional and may be utilized with embodiments of the present invention without undue experimentation.

The insulating layer 320 may include, consist essentially of, or consist of, e.g., an oxide or a nitride of the metal of which the housing body 315 is composed. For example, for a housing body 315 that includes, consists essentially of, or consists of aluminum, the insulating layer 320 may include, consist essentially of, or consist of one or more layers of aluminum oxide and/or aluminum nitride. In some embodiments, a thermal bonding layer 325 is utilized to enhance contact (and thus thermal conduction) between the electrode mount 110 and the housing 310, even if the insulating layer 320 has a rough surface. The thermal bonding layer 325 may include, consist essentially of, or consist of, for example, a thermally conductive liquid, paste, or gel material such as indium (e.g., indium paste or solder) or silver paste. The thickness of the thermal bonding layer 325 may be, for example, between approximately 0.5 µm and approximately 150 µm. The thickness of the insulating layer 320 may be, for example, between approximately 5 µm and approximately 150 µm.

All or a portion of the insulating layer 320 may be a nitride layer formed via, e.g., direct nitridation of the housing body 315 and/or carbothermic reduction of an oxide layer on housing body 315. For example, an insulating layer 320 (or a topmost insulting layer 320) that includes, consists essentially of, or consists of aluminum nitride may be formed via exposure of an aluminum housing body 315 (or an aluminum oxide layer thereon) to a nitrogen ambient at elevated temperature (e.g., greater than 1200° C.). An aluminum oxide insulating layer 320 may be formed on an aluminum housing body 315 via, e.g., anodization. In an exemplary anodization process, the housing body 315 is first cleaned in either a hot soak cleaner or in a solvent bath and may be etched in sodium hydroxide (normally with added sodium gluconate), ammonium bifluoride, or brightened in a mix of acids. The anodized layer may be produced by passing a direct current through an electrolytic solution, with the housing body 315 serving as the anode (the positive electrode). The current releases hydrogen at the cathode (the negative electrode) and oxygen at the surface of the housing body 315 anode, creating a build-up of aluminum oxide. The voltage utilized for various solutions may range from 1 to 300 V DC, although most fall in the range of 15 to 21 V. Higher voltages are typically required for thicker coatings formed in sulfuric and organic acid. The anodizing current varies with the area of housing body 315 being anodized, and typically ranges from 30 to 300 amperes/meter$^2$ (2.8 to 28 ampere/ft$^2$).

In some embodiments, anodizing of aluminum housing bodies 315 is performed in an acid solution which slowly dissolves the aluminum oxide. The acid action is balanced with the oxidation rate to form a coating with nanopores 10-150 nm in diameter. These pores allow the electrolyte solution and current to reach the aluminum surface and continue producing the coating to greater thickness beyond what is produced by autopassivation. In some embodiments, these pores are sealed in order to prevent air or water to reach the housing body 315 and initiate corrosion. In one implementation, a crystallized, partially crystallized, or micro-crystalline filler is placed into the pores, as disclosed in U.S. Pat. Nos. 8,512,872 and 8,609,254, the entire disclosure of each of which is incorporated by reference herein.

Pores in an insulating layer 320 may be at least partially impregnated or filled by introducing one or more compounds that are at least partially resistant to acidic attack or alkaline attack under various conditions. For example, the one or more compounds (e.g., metal cationic species) may be introduced into pores 106 by immersion of the housing body 315 in a bath containing one or more precursor compounds under conditions that are non-reactive to the housing body 315 or an oxide thereof. In accordance with various embodiments of the invention, the housing body 315, which may include, consist essentially of, or consist of anodized aluminum or an anodized aluminum alloy, is immersed in a first aqueous metal salt solution, preferably at ambient conditions. In addition or instead, one or more metal cationic species may be introduced into at least some of the pores by, for example, immersing the housing body 315 in an aqueous metal solution. The metal species or base metal salt in solution may at least partially impregnate at least a portion of the anodic oxide pores by diffusion phenomena. Non-limiting examples of the metal that may be utilized as a precursor compound include nickel, iron, zinc, copper, magnesium, titanium, zirconium, aluminum, and silver. The bath or aqueous metal solution may have a pH of less than about 7 and a temperature in a range of from about 15° C. to about 35° C.

Figure 4:
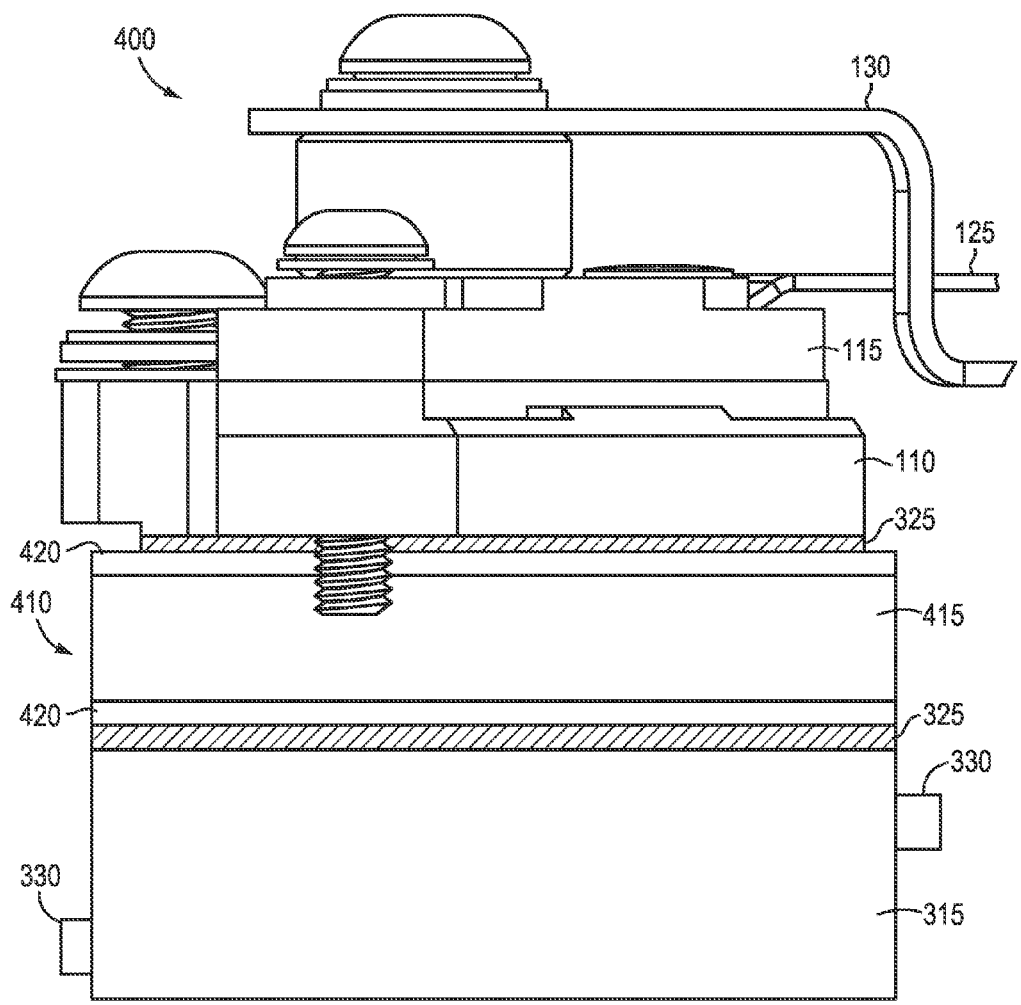

FIG. 4 depicts a packaged laser 400 featuring a composite housing 410 electrically insulated from but thermally connected to the electrode mount 110 of laser 100. As shown, the composite housing 400 may feature a ceramic body 415 mounted on and/or affixed to housing body 315. The ceramic body 415 may be thermally connected to electrode mount 110 and/or to housing body 315 via one or more thermal bonding layers 325 therebetween. The ceramic body 415 may include, consist essentially of, or consist of, for example, aluminum nitride. As shown in FIG. 4, the ceramic body 415 may also have interfacial layers 420 on one or more surfaces thereof. For example, the interfacial layers 420 may improve thermal conductivity to the bulk of the ceramic body 415 via increased interfacial contact (due to, e.g., reduced surface roughness) to the thermal bonding layers 325. The interfacial layers 420 may include, consist essentially of, or consist of one or more thermally conductive metals such as copper, silver, or gold. For example, the interfacial layers 420 may include, consist essentially of, or consist of direct-bond copper or copper flashing disposed on the ceramic body 415.

Packaged lasers in accordance with embodiments of the present invention may be utilized in WBC laser systems. FIG. 5 depicts an exemplary WBC laser system 500 that utilizes a packaged laser 505. The packaged laser 505 may correspond to, for example, lasers 100, 300, or 400 as detailed herein. In the example of FIG. 5, laser 505 features a diode bar having four beam emitters emitting beams 510 (see magnified input view 515), but embodiments of the invention may utilize diode bars emitting any number of individual beams or two-dimensional arrays or stacks of diodes or diode bars. In view 515, each beam 510 is indicated by a line, where the length or longer dimension of the line represents the slow diverging dimension of the beam, and the height or shorter dimension represents the fast diverging dimension. A collimation optic 520 may be used to collimate each beam 510 along the fast dimension. Transform optic(s) 525, which may include or consist essentially of one or more cylindrical or spherical lenses and/or mirrors, are used to combine each beam 510 along a WBC direction 530. The transform optics 525 then overlap the combined beam onto a dispersive element 535 (which may include or consist essentially of, e.g., a diffraction grating), and the combined beam is then transmitted as single output profile onto an output coupler 540. The output coupler 540 then transmits the combined beams 545 as shown on the output front view 550. The output coupler 540 is typically partially reflective and acts as a common front facet for all the laser elements in this external cavity system 500. An external cavity is a lasing system where the secondary mirror is displaced at a distance away from the emission aperture or facet of each laser emitter. In some embodiments, additional optics are placed between the emission aperture or facet and the output coupler or partially reflective surface.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser apparatus comprising:
   a beam emitter having first and second opposed surfaces;
   a first electrode mount disposed beneath and in thermal and electrical contact with the first surface of the beam emitter;
   a second electrode mount (i) disposed over and in thermal and electrical contact with the second surface of the beam emitter and (ii) electrically insulated from the first electrode mount;
   a thermally and electrically conductive housing body disposed beneath the first electrode mount;
   an insulating layer (i) disposed over the housing body, (ii) electrically insulating the housing body from the first electrode mount, and (iii) providing thermal conductivity between the first electrode mount and the housing body; and
   a thermal bonding layer disposed between the insulating layer and the first electrode mount, the thermal bonding layer (i) improving thermal conduction between the first electrode mount and the insulating layer, and (ii) being electrically conductive.

2. The laser apparatus of claim 1, wherein the beam emitter comprises a diode bar emitting a plurality of discrete beams.

3. The laser apparatus of claim 1, wherein the first and second electrode mounts comprise copper.

4. The laser apparatus of claim 1, wherein the housing body comprises aluminum.

5. The laser apparatus of claim 1, wherein the insulating layer comprises at least one of aluminum nitride or aluminum oxide.

6. The laser apparatus of claim 1, wherein the insulating layer comprises aluminum nitride, and further comprising (i) a first interfacial layer disposed between the insulating layer and the thermal bonding layer and (ii) a second interfacial layer disposed between the insulating layer and the housing body.

7. The laser apparatus of claim 6, wherein the first and second interfacial layers comprise copper.

8. The laser apparatus of claim 6, further comprising a second thermal bonding layer disposed between the second interfacial layer and the housing body.

9. The laser apparatus of claim 8, wherein the second thermal bonding layer comprises at least one of indium or silver.

10. The laser apparatus of claim 1, wherein the thermal bonding layer comprises at least one of indium or silver.

11. The laser apparatus of claim 1, wherein the housing body defines therewithin one or more cooling channels for the flow of cooling fluid therethrough.

12. A laser apparatus comprising:
   a beam emitter having first and second opposed surfaces;
   a first electrode mount disposed beneath and in thermal and electrical contact with the first surface of the beam emitter, the first electrode mount comprising copper;
   a second electrode mount (i) disposed over and in thermal and electrical contact with the second surface of the beam emitter, (ii) electrically insulated from the first electrode mount, and (iii) comprising copper;

a thermally and electrically conductive housing body disposed beneath the first electrode mount, the housing body comprising aluminum;

an insulating layer (i) disposed over the housing body, (ii) electrically insulating the housing body from the first electrode mount, (iii) providing thermal conductivity between the first electrode mount and the housing body, and (iv) comprising aluminum nitride;

a thermal bonding layer disposed between the insulating layer and the first electrode mount, the thermal bonding layer (i) improving thermal conduction between the first electrode mount and the insulating layer, (ii) being electrically conductive, and (iii) comprising at least one of indium or silver;

a first interfacial layer disposed between the insulating layer and the thermal bonding layer, the first interfacial layer comprising copper; and a second interfacial layer disposed between the insulating layer and the housing body, the second interfacial layer comprising copper.

13. The laser apparatus of claim 12, further comprising a second thermal bonding layer disposed between the second interfacial layer and the housing body, the second thermal bonding layer (i) improving thermal conduction between the insulating layer and the housing body, (ii) being electrically conductive, and (iii) comprising at least one of indium or silver.

14. The laser apparatus of claim 12, wherein the housing body defines therewithin one or more cooling channels for the flow of cooling fluid therethrough.

15. The laser apparatus of claim 12, wherein the beam emitter comprises a diode bar emitting a plurality of discrete beams.

16. A wavelength beam combining laser system comprising:
a beam emitter emitting a plurality of discrete beams and having first and second opposed surfaces;
focusing optics for focusing the plurality of beams onto a dispersive element;
a dispersive element for receiving and dispersing the received focused beams;
a partially reflective output coupler positioned to receive the dispersed beams, transmit a portion of the dispersed beams therethrough as a multi-wavelength output beam, and reflect a second portion of the dispersed beams back toward the dispersive element;
a first electrode mount disposed beneath and in thermal and electrical contact with the first surface of the beam emitter;
a second electrode mount (i) disposed over and in thermal and electrical contact with the second surface of the beam emitter and (ii) electrically insulated from the first electrode mount;
a thermally and electrically conductive housing body disposed beneath the first electrode mount;
an insulating layer (i) disposed over the housing body, (ii) electrically insulating the housing body from the first electrode mount, and (iii) providing thermal conductivity between the first electrode mount and the housing body; and
a thermal bonding layer disposed between the insulating layer and the first electrode mount, the thermal bonding layer (i) improving thermal conduction between the first electrode mount and the insulating layer, and (ii) being electrically conductive.

17. The laser system of claim 16, wherein the dispersive element comprises a diffraction grating.

18. The laser system of claim 16, wherein the first and second electrode mounts comprise copper.

19. The laser system of claim 16, wherein the housing body comprises aluminum.

20. The laser system of claim 16, wherein the insulating layer comprises at least one of aluminum nitride or aluminum oxide.

21. The laser system of claim 16, wherein the insulating layer comprises aluminum nitride, and further comprising (i) a first interfacial layer disposed between the insulating layer and the thermal bonding layer and (ii) a second interfacial layer disposed between the insulating layer and the housing body.

22. The laser system of claim 21, wherein the first and second interfacial layers comprise copper.

23. The laser system of claim 21, further comprising a second thermal bonding layer disposed between the second interfacial layer and the housing body.

24. The laser system of claim 23, wherein the second thermal bonding layer comprises at least one of indium or silver.

25. The laser system of claim 16, wherein the thermal bonding layer comprises at least one of indium or silver.

26. The laser system of claim 16, wherein the housing body defines therewithin one or more cooling channels for the flow of cooling fluid therethrough.

* * * * *